United States Patent [19]

Grunewalder et al.

[11] 4,357,396

[45] Nov. 2, 1982

[54] SILVER AND COPPER COATED ARTICLES PROTECTED BY TREATMENT WITH MERCAPTO AND/OR AMINO SUBSTITUTED THIADIAZOLES OR MERCAPTO SUBSTITUTED TRIAZOLES

[75] Inventors: John F. Grunewalder, Glenshaw; William A. Essary, Freeport, both of Pa.; John S. Ostrowski, Richardson, Tex.

[73] Assignee: PPG Industries, Inc., Pittsburgh, Pa.

[21] Appl. No.: 228,444

[22] Filed: Jan. 26, 1981

[51] Int. Cl.$^3$ ................. B32B 15/08; G02B 5/08; E06B 3/24

[52] U.S. Cl. .................. 428/626; 350/288; 252/391; 148/6.14 R; 106/14.16; 106/14.38; 428/34; 428/433; 428/457; 428/630; 428/671; 428/687

[58] Field of Search ............ 148/6.14 R; 106/14.16, 106/14.38; 252/391, 395; 428/624, 626, 671, 630, 34, 433, 457, 687; 350/288

[56] References Cited

U.S. PATENT DOCUMENTS

| | | | |
|---|---|---|---|
| 3,093,509 | 6/1963 | Wein | 427/98 |
| 3,382,087 | 5/1968 | Ostrowski | 117/35 |
| 3,457,138 | 7/1969 | Miller | 428/34 |
| 3,837,964 | 9/1974 | Cotton | 428/457 |
| 3,895,170 | 7/1975 | Tanaka | 428/457 |
| 4,178,253 | 12/1979 | Lee | 252/391 |

OTHER PUBLICATIONS

R. Q. Little, Jr. and R. W. Watson, "Inhibitors for Sulfur Corrosion of Copper and Silver", Symposium on Additives in the Petroleum Industry, American Chemical Society, Apr. 4–9, 1965, pp. D-137-D-144.

Rodney L. Leroy, "Chelate Inhibitors for Zinc and Galvanized Products", Corrosion, vol. 24, No. 3, Mar. 1978, pp. 98–108.

Ellis K. Fields, "Preparation of Lubricating Oil Additives from Dimercaptothiadiazole", Industrial and Engineering Chemistry, vol. 49, No. 9, Sep. 1957, pp. 1361–1364.

*Primary Examiner*—Ellis P. Robinson
*Attorney, Agent, or Firm*—Thomas M. Breininger

[57] ABSTRACT

The invention is directed to an article comprising a thin film of silver and/or copper contacted with a compound selected from the group consisting of a thiadiazole substituted by a mercapto group and/or an amino group and a triazole substituted by a mercapto and optionally an amino group. The invention is also directed to a method of protecting a silver and/or copper metallic film by contacting the film with a compound selected from the above group.

21 Claims, No Drawings

SILVER AND COPPER COATED ARTICLES PROTECTED BY TREATMENT WITH MERCAPTO AND/OR AMINO SUBSTITUTED THIADIAZOLES OR MERCAPTO SUBSTITUTED TRIAZOLES

BACKGROUND OF THE INVENTION

A number of articles in widespread use comprise thin films of silver and/or copper. Such films are often used, for example, to form the reflective surfaces of mirrors. Such films are also commonly used to impart partial reflectivity to glass surfaces for use, for example, in windows, decorative structural materials, and the like.

Depending on the intended use, these metallic films may vary widely in thickness. For example, the metallic layer on mirrors typically varies from about 3 to about 10 microinches (about 76.2 m$\mu$ to about 254 m$\mu$), whereas the partially reflective, metallic films on windows where the films serve as solar reflectors typically range from about $4 \times 10^{-8}$ inches to about $20 \times 10^{-8}$ inches (about 1 m$\mu$ to about 5.1 m$\mu$).

While useful for decorative and reflective purposes, silver and/or copper metallic films are readily subject to discoloration and degradation due to oxidation and heat and attack by a number of air borne contaminants such as chlorides, sulfides and other contaminants.

Although these metallic films vary in thickness, they are always quite thin. In the context of the present invention the metallic films generally have a thickness of up to about 10 microinches (about 254 m$\mu$). Presumably due to the thinness of the films, materials known to inhibit corrosion and tarnishing of the bulk metals are not sufficiently effective to prevent tarnishing and corrosion of articles on which these thin metallic films are present. In fact, in some cases such known "inhibitors" for the bulk metals, such as benzotriazole for example, actually increase the rate of deterioration of the thin film.

In most applications, especially where thin silver and/or copper films are used for decorative and partially reflective films on windows, even slight deterioration of the film over extended periods of time poses a significant problem. One attempt to solve this problem has been to coat the metallic film with an organic coating composition. However, while providing some measure of protection, even this expedient is not sufficient to prevent eventual discoloration and deterioration of the metallic film. These organic coating compositions apparently are sufficiently permeable to various contaminants which cause and promote deterioration of the metallic film, that they do not provide adequate long term protection for thin silver and/or copper films. Moreover some organic coating compositions contain reactive groups which react with the metal and discolor the film. Additionally, because of various close tolerances which must be met when thin metallic films are used in window applications, the use of organic coatings is not feasible.

U.S. Pat. No. 3,382,087 to Ostrowski discloses the treatment of articles coated with thin silver and copper films with aminotriazoles, aminotetrazoles, aminoindazoles and indazole itself.

SUMMARY OF THE INVENTION

It has now been found that a substantial measure of protection can be imparted to thin films of silver and/or copper by treatment with a thiadiazole substituted on the ring by a mercapto and/or an amino group, or a triazole substituted by a mercapto group and optionally an amino group.

DETAILED DESCRIPTION OF THE INVENTION

The invention is directed to an article comprising a thin film of a metal selected from the group consisting of silver and copper, which has been contacted with a thiadiazole substituted by at least one mercapto group and/or at least one amino group, or a triazole substituted by at least one mercapto group and optionally by an amino group, or a mixture thereof.

The invention is also directed to a method of treating an article comprising a thin film of silver and/or copper with the aforementioned compounds.

Examples of mercapto substituted thiadiazoles which may be used in the invention include: 2,5-dimercapto-1,3,4-thiadiazole, 2-mercapto-1,3,4-thiadiazole, 2,5-diamino-1,3,4-thiadiazole, 2-amino-1,3,4-thiadiazole, 2-amino-5-mercapto-1,3,4-thiadiazole, 2-ethylmercapto-1,3,4-thiadiazole, 2,5-bis(ethylmercapto)-1,3,4-thiadiazole, 2-ethylamino-1,3,4-thiadiazole, 2-propylamino-1,3,4-thiadiazole, and 2-aminoethyl-5-mercapto-1,3,4-thiadiazole.

Of those set forth above, the preferred substituted thiadiazoles include: 2,5-dimercapto-1,3,4-thiadiazole and 2-amino-5-mercapto-1,3,4-thiadiazole.

Examples of mercapto-substituted triazoles which may be used in the invention include: 3-mercapto-1,2,4-triazole, 4-mercapto-1,2,3-triazole, 3-amino-5-mercapto-1,2,4-triazole and 4-amino-5-mercapto-1,2,3-triazole.

Of those set forth above, the preferred mercapto-substituted triazoles include 3-amino-5-mercapto-1,2,4-triazole and 3-mercapto-1,2,4-triazole.

The thin metallic films which are treated in accordance with the invention may be prepared in several ways. For example, silver may be deposited from a reducing solution of a silver salt, such as an ammoniacal solution of silver nitrate containing dextrose or other reducing sugar. The silvering of glass is often carried out by first "sensitizing" the glass with an aqueous solution of a tin salt. Thin metallic copper films may be deposited by generally known methods including electrolytic deposition, galvanic deposition, or chemical deposition from solutions of copper salts. A preferred method for use on glass, ceramic, and similar siliceous surfaces is deposition by contacting a previously silvered surface with an aqueous alkaline solution containing a copper salt, a reducing agent, a tartrate salt, and a nickel or cobalt salt as described in U.S. Pat. No. 3,457,138. Other methods include the use of copper gluconate solution as described, for example, in U.S. Pat. No. 3,093,509.

Treatment of the metallic film according to the invention may be carried out merely by contacting the metallic film with the previously described mercapto and/or amino substituted thiadiazole or mercapto substituted triazole. For example, a solution of the mercapto and/or amino substituted thiadiazole or mercapto substituted triazole may be contacted with the metallic film as by immersion or by flowing the solution over the film. Solutions of varying concentration may be used. Solution concentrations as low as 0.01 percent by weight may be employed. Preferably, the solution concentrations are at least 0.10 percent by weight and most preferably at least 1.0 percent by weight. The compounds may be dissolved in any suitable organic or inorganic solvent. Preferably the compounds are dissolved in an aqueous or alcoholic medium.

The treatment time is not critical. Typically contact times of a few seconds are used. However, silver and/or copper films contacted even momentarily with the substituted thiadiazoles or mercapto substituted triazoles are protected to some degree. However, generally treatment times of at least 2 seconds, typically about 2 to 5 seconds are employed. Longer treatment times can be used but provide no apparent advantage. After treatment, the films are usually rinsed and dried. Although rinsing may be omitted, it is preferable, especially when an organic coating is to be applied over the treated metal film. The film surface may be rinsed with water or any suitable nonreactive liquid.

When the mercapto and/or amino substituted thiadiazoles or mercapto substituted triazoles are applied in solution to the metallic film, the pH of the solution generally should be greater than about 5, preferably greater than about 7, and most preferably greater than about 8. If the pH is too low, the thin metallic film will be adversely attacked as will be generally appreciated by those in the art.

In addition to immersion and flow contact techniques already mentioned, any generally known means for applying solutions of these compounds may be employed including, for example, spraying, sputtering, brushing, and the like.

Furthermore, the mercapto and/or amino substituted thiadiazoles and mercapto substituted triazoles may be in admixture with organic coating compositions that may be applied to the metallic films. Generally, any compatible organic film forming compositions may be applied over the metallic film. Preferred organic coating compositions include those based on acrylic resins, alkyd resins, or vinyl halide polymers or copolymers; but others may be used such as oleoresinous varnishes, nitrocellulose compositions, phenol-formaldehyde resin varnishes and the like. The organic coating compositions generally are applied to provide a dry film thickness of about 0.2 to about 3 mils.

Additionally, due to at least limited permeability of most organic films, the compounds used in the invention may be applied to a dry organic coating layer which has been already applied to the metallic film.

The following examples illustrate the invention. All parts and percentages are by weight unless stated otherwise. Wherever used herein, "pbw" means "parts by weight".

EXAMPLE 1

(a) A reducing solution containing 1 percent by weight of dextrose is prepared as follows. A mixture is prepared from 396 grams (g) of dextrose, 4 liters (l) of water, 10 milliliters (ml) of aqueous 36 percent by weight formaldehyde, and 6 ml of concentrated sulfuric acid. 425 ml (440 g) of this mixture is diluted with deionized water to 4 liters thereby producing a reducing solution containing 1 percent by weight dextrose.

An aqueous silver nitrate solution is prepared containing 0.4 percent by weight of silver nitrate.

(b) Three 6 inch by 18 inch panels of window glass are cleaned with a felt block and an aqueous slurry of cerium oxide and rinsed thoroughly with water. The glass surfaces are then contacted with a 0.15 percent by weight stannous chloride solution and again washed with water. The glass surfaces are then silvered to a bright mirror finish by spraying each of them for between 75 and 90 seconds with the reducing solution and silver nitrate solution of part (a) above intermixed by means of an appropriate spray gun. The silvered glass surfaces are washed with water leaving silver films containing about 70 to about 90 milligrams (mg) of silver per square foot (about 750 mg to about 970 mg of silver per square meter).

Next the silvered surfaces of the above 3 panels are coated with copper to a bright shiny finish by spraying each of them for between 15 to 20 seconds with a solution containing 80 g of cupric sulfate, 4 ml of concentrated sulfuric acid and 1 liter of deionized water, intermixed by means of a spray gun with a slurry of 4.0 g of zinc dust in 3 liters of deionized water. These copper films each contain about 18 to about 25 mg of copper per square foot (about 190 to about 270 mg of copper per square meter).

(c) Next the freshly silvered and copper surfaces of the glass panels of part (b) above are washed with deionized water and, while still wet, treated by rinsing with an aqueous solution containing 1.0 percent by weight of 2-amino-5-mercapto-1,3,4-thiadiazole and sufficient aqueous 28 percent by weight ammonium hydroxide to raise the pH to 9.0. Ten seconds after the solution containing the 2-amino-5-mercapto-1,3,4-thiadiazole is applied, the treated panels are washed first with deionized water and second with acetone and then force dried with air.

(d) To the treated surfaces of the dried panels of part (c) above is applied an aqueous organic coating composition containing the materials in the following TABLE I.

TABLE I

| | Percent by Weight |
|---|---|
| Copolymer of ethylene and vinyl chloride[1] | 24.58 |
| Melamine based crosslinking agent[2] | 11.35 |
| Deionized water | 20.68 |
| Defoaming agent[3] | 0.91 |
| Diethylene glycol monobutyl ether | 5.07 |
| Triethylamine | 0.54 |
| Acrylic grind resin[4] | 2.89 |
| Lampblack | 1.77 |
| Talc[5] | 11.03 |
| Aluminum silicate | 10.84 |
| Lead carbonate | 6.80 |
| Titanium dioxide[6] | 3.54 |

[1]AIRFLEX 6530 from Air Products and Chemicals, Inc.
[2]RESIMENE LTX-128 from Monsanto Company
[3]Foamkill 639 from Crucible Chemical Company
[4]A copolymer (prepared from 70 pbw isobutyl methacrylate and 30 pbw acrylic acid) having an acid value of about 78, which copolymer has been reacted with sufficient polyoxypropylenediamine of molecular weight about 230 (available from Jefferson Chemical Co., Inc. as JEFFAMINE D-230) in dipropylene glycol monomethyl ether and ethylene glycol monoethyl ether, until the resulting product has an acid value of about 62 and contains 43 percent by weight solids.
[5]MISTRON RCS from Cyprus Industrial Minerals Company
[6]R-960 from E. I. DuPont de Nemours and Company After application of the organic coating composition the treated panels are allowed to air dry for about 20 minutes and then cured for 3 minutes in an infra-red oven to a maximum temperature of about 121° Centigrade. Approximately 20 hours after the panels are removed from the infra-red oven, they are cut so as to produce six 6 inch by 6 inch test mirror sections.

(e) One of the test mirror sections of part (d) above (along with a 6 inch by 6 inch control mirror prepared in the same way as the test mirror section except for the treatment with the 1.0 percent by weight solution of 2-amino-5-mercapto-1,3,4-thiadiazole is placed in a salt spray according to test ASTM B 117-73 except that 20 percent by weight sodium chloride is used in the salt spray instead of 5 percent by weight sodium chloride as described in the ASTM test.

After 64 hours in the salt spray, approximately 25 percent of the silvered surface of the control mirror is corroded whereas no corrosion of the silvered surface of the test mirror section has occurred.

After 94 hours in the salt spray approximately 35 percent of the silvered surface of the control mirror is corroded whereas the test mirror section remains uncorroded.

After 118 hours in the salt spray approximately 50 percent of the silvered surface of the control mirror is corroded whereas the test mirror section still remains uncorroded.

After 175 hours in the salt spray approximately 75 percent of the silvered surface of the control mirror is corroded whereas a light tarnish in the silvered surface of the test mirror section is just visible.

EXAMPLE 2

A glass panel is cleaned, silvered, coated with a layer of copper, treated by rinsing with a solution of 2-amino-5-mercapto-1,3,4-thiadiazole and dried as described in EXAMPLE 1.

To the treated surface of the dry glass panel is applied an aqueous organic composition containing the materials in the following TABLE 2

TABLE 2

| | Percent by Weight |
|---|---|
| Copolymer of ethylene and vinyl chloride[1] | 19.67 |
| Melamine based crosslinking agent[2] | 11.14 |
| Aqueous phenolic resin[3] | 5.57 |
| Deionized water | 19.89 |
| Defoaming agent[4] | 0.26 |
| Defoaming agent[5] | 0.65 |
| Diethylene glycol monobutyl ether | 4.45 |
| Triethylamine | 0.57 |
| Acrylic grind resin[6] | 4.37 |
| Lampblack | 1.74 |
| Talc[7] | 10.87 |
| Aluminum silicate | 14.00 |
| Lead carbonate | 3.34 |
| Titanium dioxide[8] | 3.48 |

[1] AIRFLEX 6530 from Air Products and Chemicals, Inc.
[2] RESIMENE LTX-128 from Monsanto Company
[3] LSU-648 from Ciba-Geigy Corporation
[4] Drew L-493 from Drew Chemical Corporation
[5] Foamkill 639 from Crucible Chemical Company
[6] ACRYSOL I-94 from Rohm and Haas Company
[7] MISTRON RCS from Cyprus Industrial Minerals Company
[8] R-960 from E. I. DuPont de Nemours and Company Following application of the organic coating composition, the treated panel is air dried and the organic coating cured as described in EXAMPLE 1.

Next, the panel, which serves as a test mirror, is placed in a salt spray as described in EXAMPLE 1 along with a control mirror prepared in the same way as the test mirror except for the treatment with 2-amino-5-mercapto-1,3,4-thiadiazole. After 120 hours in the salt spray approximately 80 percent of the silvered surface of the control mirror is corroded whereas only about 31 percent of the silvered surface of the test mirror is corroded.

EXAMPLE 3

A glass panel is cleaned, silvered and coated with a layer of copper as described in EXAMPLE 1. Next the freshly silvered and coppered surface of the panel is washed with deionized water and, while still wet, treated by rinsing with an aqueous solution containing 1.0 percent by weight of 3-mercapto-1,2,4-triazole. The treated panel is then washed first with deionized water and second with acetone and then force dried with air.

To the treated surface of the dried panel is applied an aqueous organic coating composition as described in EXAMPLE 2.

Following application of the organic coating composition, the treated panel is air dried and the organic coating cured as described in EXAMPLE 1.

Next, the panel, which serves as a test mirror, is placed in a salt spray as described in EXAMPLE 1 along with a control mirror prepared in the same way as the test mirror except for the treatment with 3-mercapto-1,2,4-triazole. After 120 hours in the salt spray approximately 80 percent of the silvered surface of the control mirror is corroded whereas only about 31 percent of the silvered surface of the test mirror is corroded.

EXAMPLE 4

A glass panel is cleaned, silvered and coated with a layer of copper as described in EXAMPLE 1. Next the freshly silvered and coppered surface of the panel is washed with deionized water and, while still wet, treated by rinsing with an aqueous solution containing 1 percent by weight of 3-amino-5-mercapto-1,2,4-triazole. The treated panel is then washed first with deionized water and second with acetone and then force dried with air.

To the treated surface of the dried panel is applied an aqueous organic coating composition as described in EXAMPLE 2.

Following application of the organic coating composition, the treated panel is air dried and the organic coating cured as described in EXAMPLE 1.

Next, the panel, which serves as a test mirror, is placed in a salt spray as described in EXAMPLE 1 along with a control mirror prepared in the same way as the test mirror except for the treatment with 3-amino-5-mercapto-1,2,4-triazole. After 120 hours in the salt spray approximately 80% of the silvered surface of the control mirror is corroded whereas only about 25% of the silvered surface of the test mirror is corroded.

What is claimed is:

1. An article comprising a thin film having a thickness of up to about 10 microinches of a metal selected from the group consisting of silver and copper, said film having been contacted with a compound selected from the group consisting of a thiadiazole substituted on the ring by a least one mercapto group and/or at least one amino group, and a triazole substituted on the ring by at least one mercapto group and optionally by at least one amino group.

2. The article of claim 1 wherein said film is attached to a glass surface.

3. The article of claim 1 wherein said metal is copper.

4. The article of claim 1 wherein said compound is selected from the group consisting of 2,5-dimercapto-1,3,4-thiadiazole, 2,5-diamino-1,3,4-thiadiazole, 2-amino-5-mercapto-1,3,4-thiadiazole, 3-amino-5-mercapto-1,2,4-triazole, and 3-mercapto-1,2,4-triazole.

5. An article comprising a glass surface having thereon an adherent plural coating comprising at least one layer having a thickness of up to about 10 microinches of a metal selected from the group consisting of silver and copper, and a superimposed layer of an organic film-forming coating composition compatible with said metal, at least one of the layers of said plural coating having been contacted with a compound selected from the group consisting of a thiadiazole substituted on the ring by at least one mercapto group and/or at least one amino group, and a triazole substituted on the ring by at least one mercapto group and optionally at least one amino group.

6. The article of claim 5 wherein said metal is copper.

7. The article of claim 6 wherein said compound is selected from the group consisting of 2,5-dimercapto-1,3,4-thiadiazole, 2,5-diamino-1,3,4-thiadiazole, 2-amino-5-mercapto-1,3,4-thiadiazole, 3-amino-5-mercapto-1,2,4-triazole, and 3-mercapto-1,2,4-triazole.

8. A mirror comprising a glass surface having thereon an adherent metallic coating having a thickness of up to about 10 microinches comprising at least one metal selected from the group consisting of silver and copper, the outer surface of said metallic coating having been contacted with a compound selected from the group consisting of a thiadiazole substituted on the ring by at least one mercapto group and/or at least one amino group, and a triazole substituted on the ring by at least one mercapto group and optionally by at least one amino group.

9. A mirror comprising a silvered glass surface having thereon a plural coating comprising a thin copper layer having a thickness of up to about 10 microinches and a superimposed layer of an organic film-forming composition compatible with said copper layer, at least one of said layers having been contacted with a compound selected from the group consisting of a thiadiazole substituted on the ring by at least one mercapto group and/or at least one amino group, and a triazole substituted on the ring by at least one mercapto group and optionally by at least one amino group.

10. The mirror of claim 9 wherein said compound is selected from the group consisting of 2,5-dimercapto-1,3,4-thiadiazole, 2,5-diamino-1,3,4-thiadiazole, 2-amino-5-mercapto-1,3,4-thiadiazole, 3-amino-5-mercapto-1,2,4-triazole, and 3-mercapto-1,2,4-triazole.

11. The mirror of claims 9 or 10 wherein said copper layer is contacted with said compound.

12. A mirror comprising a silvered glass surface having thereon a plural coating comprising a thin copper layer having a thickness of up to about 10 microinches and a superimposed layer of an organic film-forming composition compatible with said copper layer, said composition being in admixture with a compound selected from the group consisting of a thiadiazole substituted on the ring by at least one mercapto group and/or at least one amino group, and a triazole substituted on the ring by at least one mercapto group and optionally at least one amino group.

13. An article which is at least partially light transmissive comprising a glass member having thereon a thin light transmissive coating comprising at least one metal selected from the group consisting of silver and copper, said coating having been contacted with a compound selected from the group consisting of a thiadiazole substituted on the ring by at least one mercapto group and/or at least one amino group, and a triazole substituted on the ring by at least one mercapto group and optionally by at least one amino group.

14. The article of claim 13 wherein said metal is copper.

15. The article of claims 13 or 14 wherein said compound is selected from the group consisting of 2,5-dimercapto-1,3,4-thiadiazole, 2,5-diamino-1,3,4-thiadiazole, 2-amino-5-mercapto-1,3,4-thiadiazole, 3-amino-5-mercapto-1,2,4-triazole, and 3-mercapto-1,2,4-triazole.

16. The article of claim 13 wherein said coating comprises a silver layer and a superimposed copper layer, the outer surface of said copper layer having been contacted with said compound.

17. A multiple glazed unit comprising a plurality of glass sheets hermetically sealed at their edges to form an enclosed air space at least one of said glass sheets having its inner surface coated with an adherent light transmissive coating comprising a silver layer and a superimposed copper layer, said coating having been contacted with a compound selected from the group consisting of a thiadiazole substituted on the ring by at least one mercapto group and/or by at least one amino group, and a triazole substituted on the ring by at least one mercapto group and optionally by at least one amino group.

18. A method of treating an article comprising a thin film having a thickness of up to about 10 microinches which comprises at least one metal selected from the group consisting of silver and copper, said method comprising contacting said film with a solution of a compound selected from the group consisting of a thiadiazole substituted on the ring by at least one mercapto group and/or by at least one amino group, and a triazole substituted on the ring by at least one mercapto group and optionally by at least one amino group, said solution containing at least 0.01 percent by weight of said compound.

19. In a method of producing an article comprising a glass surface having thereon a plural coating in which there is applied to said glass surface at least one layer having a thickness of up to about 10 microinches of a metal selected from the group consisting of silver and copper and a superimposed layer of an organic film-forming coating composition, the improvement which comprises contacting at least one of said layers with a compound selected from the group consisting of a thiadiazole substituted on the ring by at least one mercapto group and/or by at least one amino group, and a triazole substituted on the ring by at least one mercapto group and optionally by at least one amino group.

20. The improvement of claim 19 wherein the layer of said metal is contacted with a solution of said compound prior to the application of said coating composition.

21. The improvement of claim 20 wherein said compound is applied in admixture with said composition.

* * * * *